(12) United States Patent
Hirayanagi

(10) Patent No.: US 7,483,123 B2
(45) Date of Patent: Jan. 27, 2009

(54) SUBSTRATE CONVEYOR APPARATUS, SUBSTRATE CONVEYANCE METHOD AND EXPOSURE APPARATUS

(75) Inventor: Noriyuki Hirayanagi, Tokyo (JP)

(73) Assignee: Nikon Corporation, Tokyo (JP)

( * ) Notice: Subject to any disclaimer, the term of this patent is extended or adjusted under 35 U.S.C. 154(b) by 115 days.

(21) Appl. No.: 11/235,130

(22) Filed: Sep. 27, 2005

(65) Prior Publication Data
US 2006/0087638 A1  Apr. 27, 2006

(30) Foreign Application Priority Data
Oct. 26, 2004  (JP)  ............... 2004-310919

(51) Int. Cl.
*G03B 27/58* (2006.01)
(52) U.S. Cl. .......................... 355/72; 355/75
(58) Field of Classification Search .............. 355/53, 355/72, 75; 378/34, 35; 250/548, 492.1
See application file for complete search history.

(56) References Cited
U.S. PATENT DOCUMENTS

| | | | |
|---|---|---|---|
| 4,984,953 A | 1/1991 | Nakazato et al. | |
| 6,090,176 A | 7/2000 | Yoshitake et al. | |
| 6,239,863 B1 | 5/2001 | Catey et al. | |
| 6,281,510 B1 | 8/2001 | Yoshitake et al. | |
| 6,317,479 B1 | 11/2001 | Chiba et al. | |
| 6,646,720 B2 | 11/2003 | Ramamoorthy et al. | |
| 6,728,332 B2 | 4/2004 | Chiba et al. | |
| 6,753,945 B2 | 6/2004 | Heerens et al. | |
| 6,826,451 B2 | 11/2004 | del Puerto et al. | |
| 6,906,783 B2 | 6/2005 | del Puerto et al. | |
| 6,912,043 B2 | 6/2005 | Galburt | |
| 2003/0162101 A1 | 8/2003 | Heerens et al. | |
| 2003/0227605 A1 | 12/2003 | del Puerto et al. | |
| 2005/0057740 A1 | 3/2005 | del Puerto et al. | |
| 2005/0231707 A1 | 10/2005 | Galburt | |

FOREIGN PATENT DOCUMENTS

| | | |
|---|---|---|
| JP | S63-208414 | 8/1988 |
| JP | H06-002699 | 1/1994 |

*Primary Examiner*—Della J. Rutledge
(74) *Attorney, Agent, or Firm*—Finnegan, Henderson, Farabow, Garrett & Dunner, L.L.P.

(57) ABSTRACT

With respect to a substrate conveyor apparatus that, being a substrate conveyor apparatus that carries substrate on which patterns are formed, carries the substrate in a state protected by a protective cover when the substrate is not used, a substrate conveyor apparatus having a cover protection means that covers the inner surface of the protective cover when the substrate is used.

26 Claims, 6 Drawing Sheets

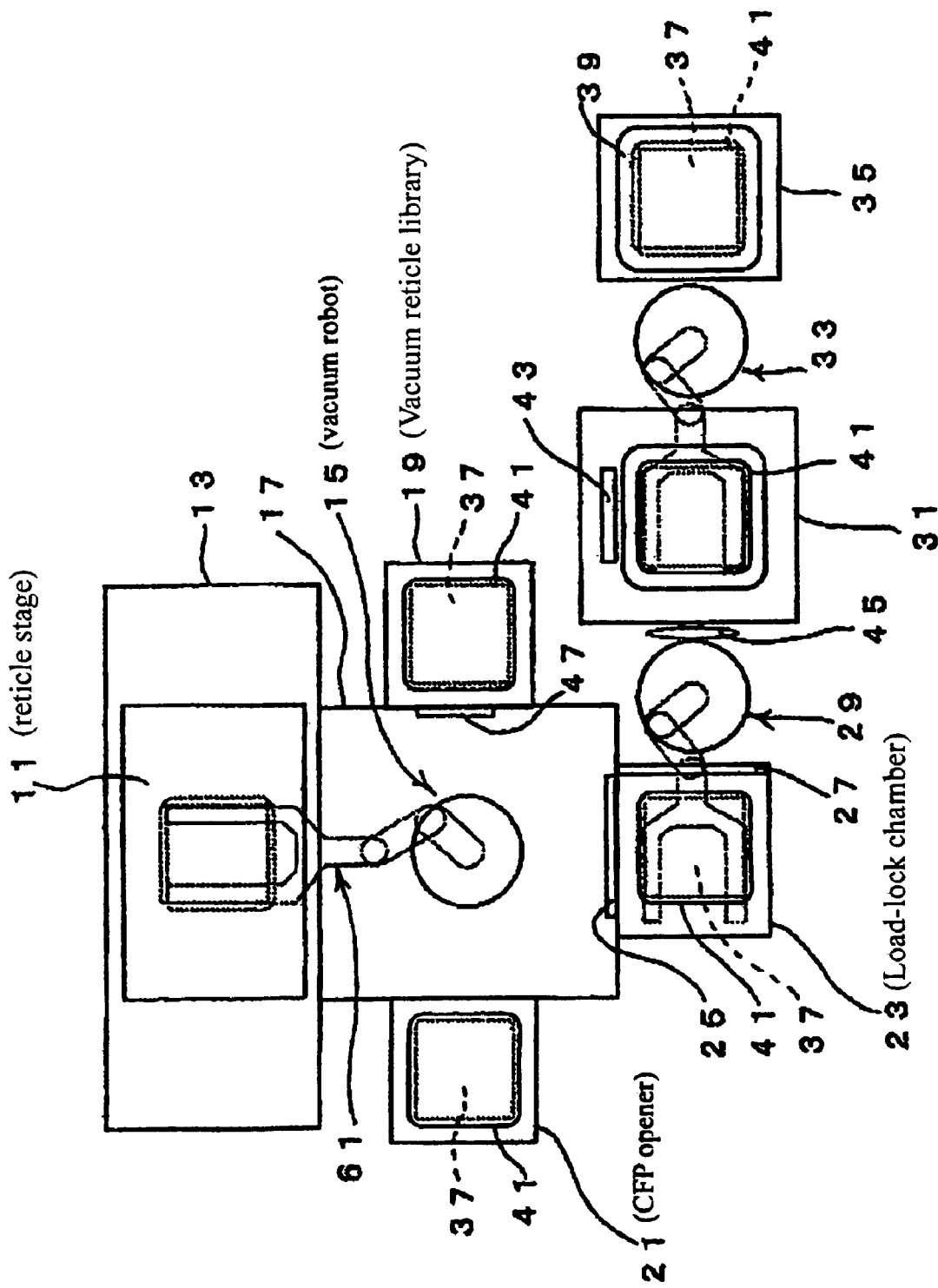
(Fig. 1)

(Fig. 2)
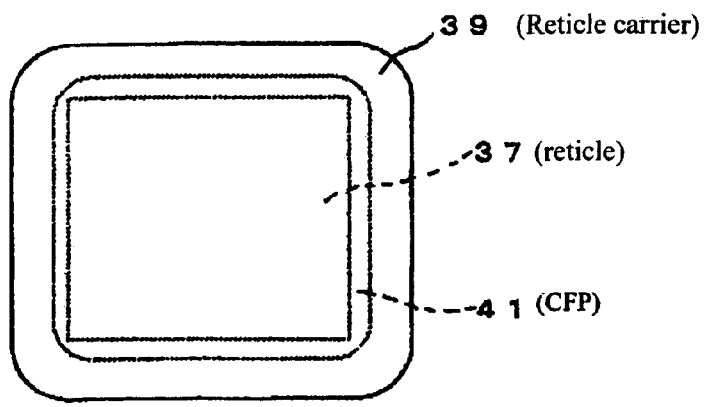
(Fig. 3)
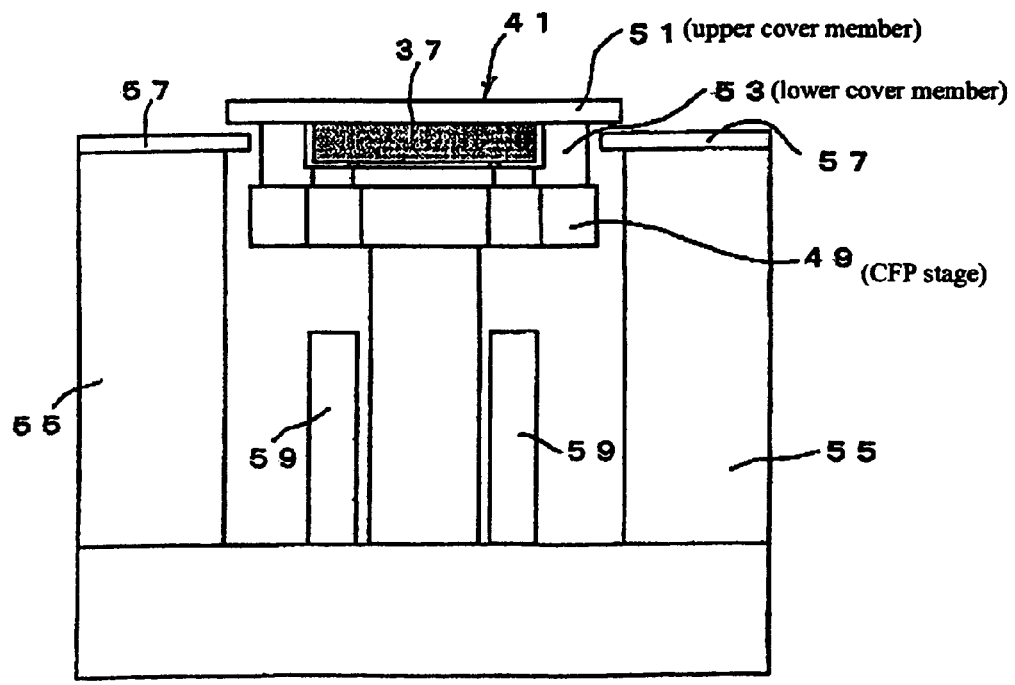

(Fig. 4)
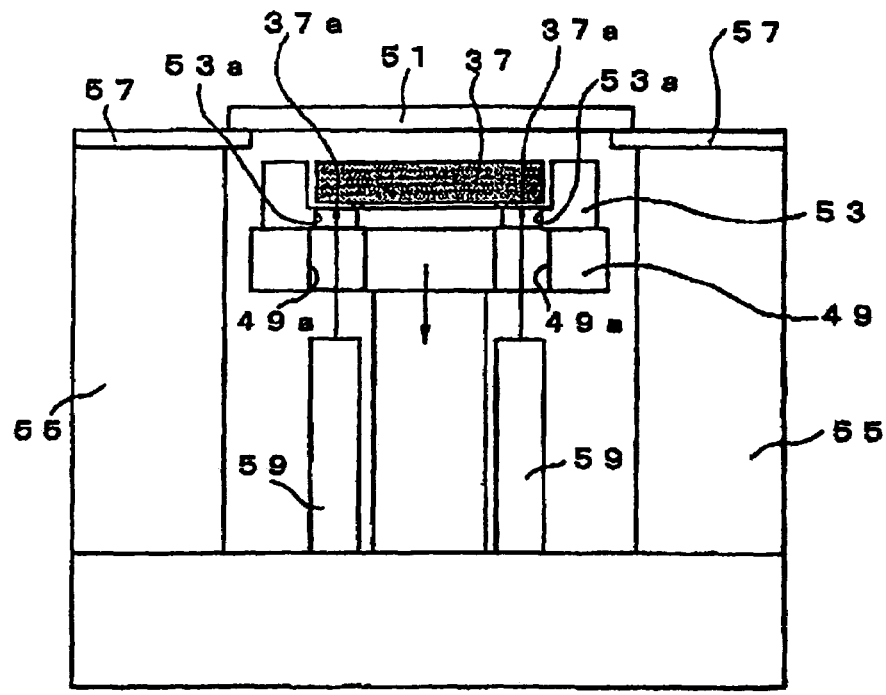
(Fig. 5)
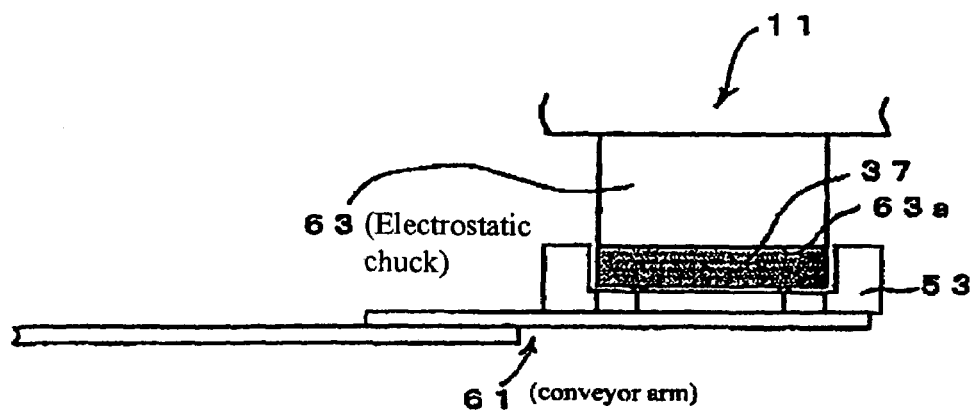

(Fig. 7)
(a)
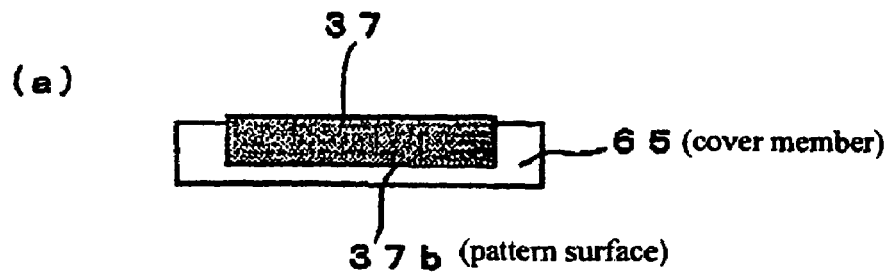
(b)
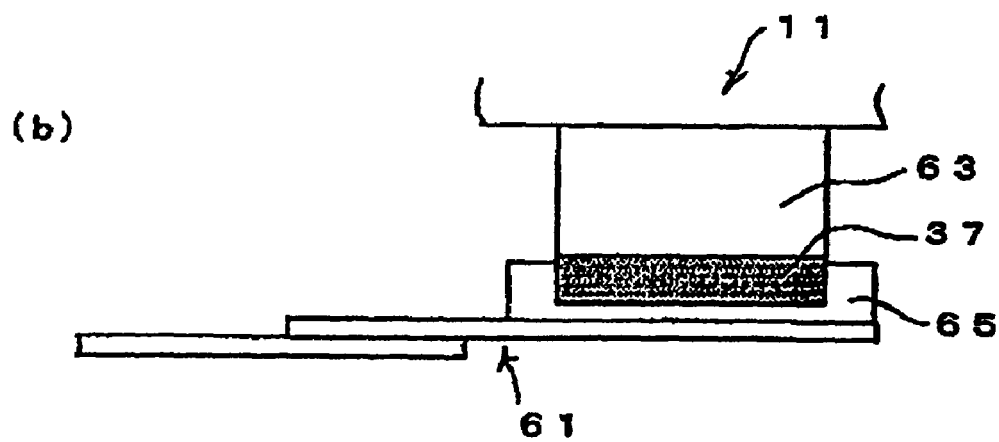
(c)
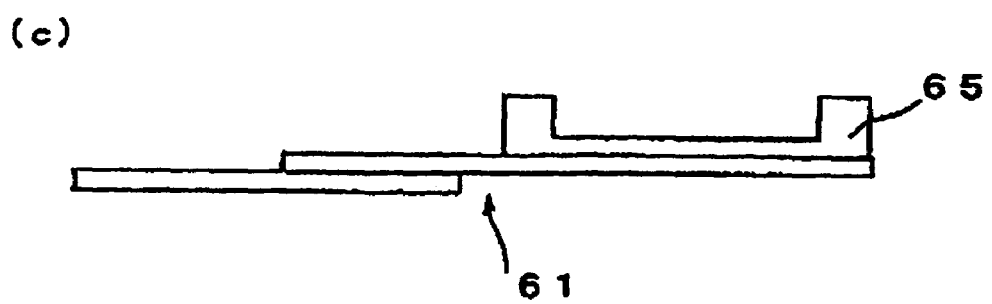
(d)
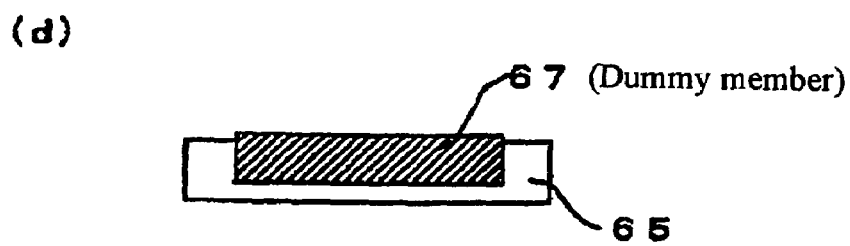

SUBSTRATE CONVEYOR APPARATUS, SUBSTRATE CONVEYANCE METHOD AND EXPOSURE APPARATUS

BACKGROUND OF THE INVENTION

The present invention pertains to a substrate conveyor apparatus that carries a substrate on which patterns are formed to a substrate exposure apparatus equipped with a substrate conveyance method and a substrate conveyor apparatus.

With a reticle (also known as a mask) used in next-generation lithography such as EPL and EUVL, a common problem is the weakness that a pellicle that prevent the adhering of defect-causing particles onto the reticle pattern face cannot be used.

As a means to resolve this problem, there is a proposal to attach a protective cover when a reticle is not used and only remove it during exposure. For example, refer to U.S. Pat. No. 6,239,863.

SUMMARY OF THE INVENTION

However, in the above method, there was the problem that the protective cover for the reticle used during exposure is left in a state wherein the inner surface of the protective cover is exposed, and it is easy for particles and the like to become adhered to the inner surface of the protective cover.

The present invention is intended to resolve the conventional problems concerned, therefore the object is to provide a substrate conveyor apparatus and a substrate exposure apparatus equipped with a substrate conveyance method and a substrate conveyor apparatus thereof that can easily and reliably prevent contamination of the inner surface of the protective cover when a substrate is used.

In the first viewpoint of the present invention, a substrate conveyor apparatus that, being a substrate conveyor apparatus that carries substrates on which patterns are formed, carries the substrates in a state protected by a protective cover when the substrate is not used, and is characterized by having a cover protection means that covers the inner surface of the protective cover when the substrate is used.

In the second viewpoint of the present invention, the cover protection means is characterized by covering the inner surface of the protective cover when the substrate is used in exposure.

In the third viewpoint of the present invention, the protective cover comprises a plurality of cover members that cover the substrate and are disposed so as to be attachable and removable, and the cover protective means is characterized by holding the plurality of cover members in a standby position in a closed state.

In the fourth viewpoint of the present invention, the cover protective means is characterized by, after carrying the substrate along with one part of the plurality of cover members to the substrate exposure position, returning the one part of the cover members to the standby position and bringing the plurality of cover members into a closed state.

In the fifth viewpoint of the present invention, the closed state of the plurality of cover members is characterized by being a state in which the plurality of cover members are sealed.

In the sixth viewpoint of the present invention, the protective cover comprises a cover member that covers the pattern on the substrate and is disposed so as to be attachable and removable, and the cover protective means is characterized by holding the cover member in a standby position in a state mounted to a dummy member that imitates the shape of the substrate.

In the seventh viewpoint of the present invention, the standby position is characterized by being a position wherein the substrate is aligned.

In the eighth viewpoint of the present invention, the standby position is characterized by being a position wherein the cover member is removed from the substrate.

In the ninth viewpoint of the present invention, the standby position is characterized by being a library part that stores the substrate in an exposure atmosphere.

In the tenth viewpoint of the present invention, the standby position is characterized by grounding the protective cover.

In the eleventh viewpoint of the present invention, a substrate conveyor apparatus that, being a substrate conveyor apparatus that carries substrates on which patterns are formed, carries the substrate in a state protected by a protective cover when the substrate is not used, and is characterized by having a grounding means that grounds the substrate or the protective cover.

In the twelfth viewpoint of the present invention, the grounding means is characterized by being provided on the setting machine that sets the substrate or the protective cover.

In the thirteenth viewpoint of the present invention, the substrate is characterized by being grounded via the protective cover.

In the fourteenth viewpoint of the present invention, a substrate conveyance method that, being a substrate conveyance method that carries substrates on which patterns are formed, carries the substrates in a state protected by a protective cover when the substrate is not used, and is characterized by holding the protective cover on standby so that the inner surface of the protective cover is covered when the substrate is used.

In the fifteenth viewpoint of the present invention, the substrate exposure apparatus is characterized by being equipped with the substrate conveyor apparatus.

In the substrate conveyor apparatus of the present invention, when the substrate is used, the inner surface of the protective cover is covered by a cover protection means, therefore when the substrate is used, contamination of the inner surface of the protective cover can be easily and reliably prevented.

In addition, in the substrate conveyor apparatus of the present invention, the substrate or the protective cover are grounded by a grounding means, therefore electrostatic charging of the substrate or the protective cover can be easily and reliably prevented.

In the substrate conveyance method of the present invention, when the substrate is used, the protective cover is held in standby in a state wherein the inner surface of the protective cover is covered, therefore contamination of the inner surface of the protective cover can be easily and reliably prevented.

In the exposure apparatus of the present invention, a substrate with little contamination is used, obtaining a product with high yield.

BRIEF DESCRIPTION OF THE DRAWINGS

FIG. 1 is an illustration showing a first embodiment of the substrate conveyor apparatus of the present invention.

FIG. 2 is an illustration showing a reticle carrier from FIG. 1.

FIG. 3 is an illustration showing the details of a CFP stage from FIG. 1.

FIG. 4 is an illustration showing the state exposing the reticle from the CFP in FIG. 3.

FIG. 5 is an illustration showing a state wherein the reticle is conveyed from a CFP stage to a reticle stage of FIG. 1.

FIG. 7 is an illustration showing a second embodiment of the substrate conveyor apparatus of the present invention.

DETAILED DESCRIPTION OF THE PREFERRED EMBODIMENT

Figure 6:
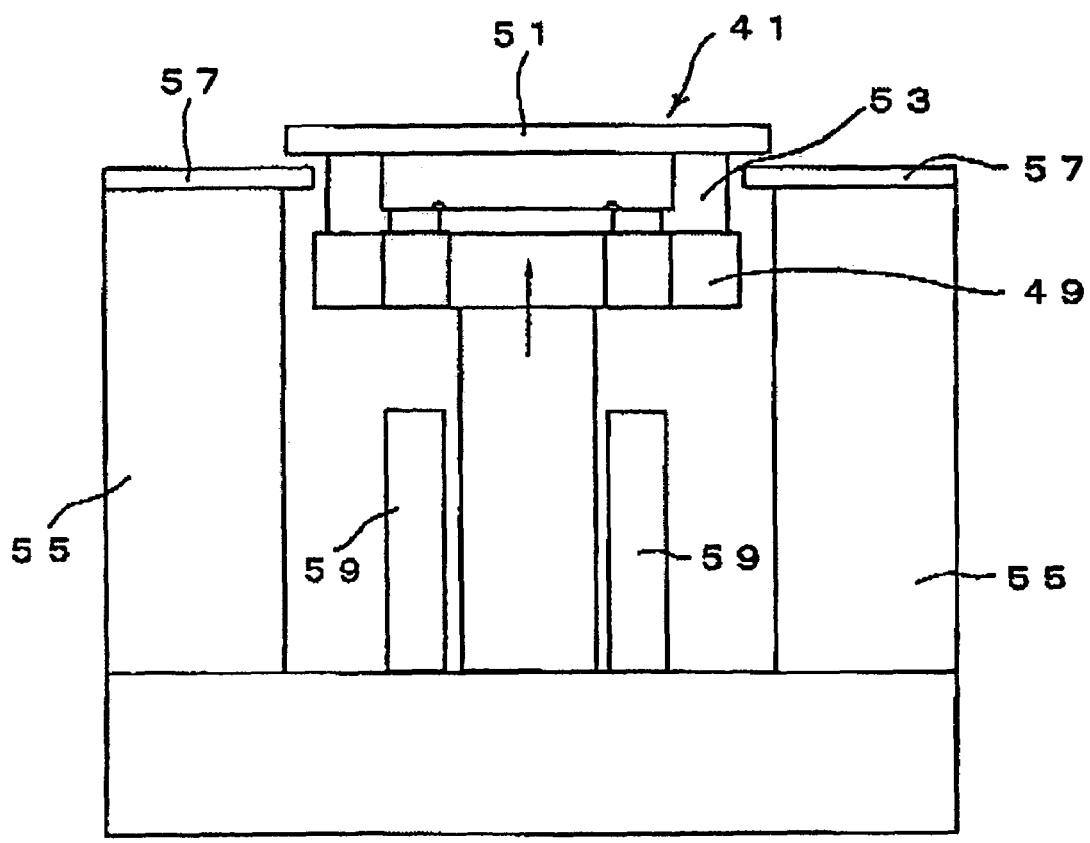
FIG. 6 is an illustration showing the state in the CFP stage of FIG. 1 where the CFP is in standby.

Below we will explain the details of embodiments of the present invention using drawings. Note that the present invention is not limited to the following embodiments.

First Embodiment

FIG. 1 shows the first embodiment of the substrate conveyor apparatus of the present invention.

This substrate conveyor apparatus is provided adjacent to an exposure chamber 13 wherein reticle stage 11 and the like are disposed. On one side of reticle chamber 13, a robot chamber 17 is provided wherein a vacuum robot 15 is disposed. On one side of robot chamber 17, a vacuum reticle library 19 is provided, and on the other side a clean filter pod opener 21 (hereafter called "CFP opener") is provided. Exposure chamber 13, robot chamber 17, vacuum reticle library 19 and CFP opener 21 are in vacuum atmosphere.

In the position where robot chamber 17 faces exposure chamber 13, a load-lock chamber 23 is disposed. Load-lock chamber 23 communicates to robot chamber 17 via second gate valve 25. In addition, [load-lock chamber 23] communicates to atmospheric air via a first gate valve 27.

On the other side of load-lock chamber 23, a reticle carrier opener 31 is disposed via a second atmospheric robot 29. On the other side of reticle carrier opener 31, an atmospheric reticle library 35 is disposed via a first atmospheric robot 33.

With the above substrate conveyor apparatus, in the atmospheric reticle library 35, as shown in FIG. 2, an EUVL reticle 37 used in exposure is placed in a state doubly protected by a reticle carrier 39 and a clean filter pod (hereafter called "CFP") 41. CFP 41 has the function of a protective cover protecting reticle 37 in a low-pressure atmosphere.

The reticle carrier 39 placed in atmospheric reticle library 35 is conveyed by the first atmospheric robot 33 to reticle carrier opener 31. Then, reticle carrier 39 is identified by reticle carrier ID reader 43. At this reticle carrier opener 31 reticle carrier 39 is opened and CFP 41 is exposed. The exposed CFP 41 is heated about 2~3 degrees Celsius by temperature compensation lamp 45. The heated CFP 41 is conveyed by a second atmospheric robot 29 onto load-lock chamber 23 wherein only the first gate valve 27 is opened. Note that the steps from reticle carrier opener 31 to load-lock chamber 23 are in a clean environment.

In load-lock chamber 23 accommodating the CFP 41, vacuum evacuation occurs in a state where the first gate valve 27 and second gate valve 25 are closed. When a specified state of vacuum is achieved in load-lock chamber 23, only second gate valve 25 opens and CFP 41 is conveyed to vacuum reticle library 19 by vacuum robot 15.

In vacuum reticle library 19, for example around 5 CFP's, each of which houses a reticle, are stored.

The reticle 37 is held at a specified temperature by a temperature adjustment mechanism (not shown). The reticle 37 stored in CFP 41 is identified by reticle ID reader 47. The identified reticle 37 is conveyed by vacuum robot 15 to CFP opener 21 while housed in CFP 41.

In CFP opener 21, CFP 41 is opened and reticle 37 exposed.

In this embodiment, as shown in FIG. 3, the CFP 41 conveyed to CFP opener 21 is set on CFP stage 49. CFP 41 comprises upper cover member (upper lid) 51 and lower cover member (lower lid) 53. Then, as shown in FIG. 4, by lowering CFP stage 49 the exterior of upper cover member 51 is locked by locking member 57 on the upper end of support member 55, exposing reticle 37.

In this embodiment, at the lower region of CFP stage 49, a reference microscope 59 is disposed for performing prealignment of reticle 37. Then, a prealignment mark 37a formed on the lower surface of reticle 37 is detected by reference microscope 59 from a perforating hole 49a formed in CFP stage 49 and a transparent window 53a established in lower cover member 53 through transparent window 53a, and prealignment occurs by driving CFP stage 49. At this time, the reticle ID can be confirmed by detecting the reticle ID, such as a bar code, through the transparent window 53a in lower cover member 53.

The reticle 37 that has completed prealignment, as shown in FIG. 5, is conveyed housed in the lower cover 53 of CFP 41 to reticle stage 11 by conveyor arm 61 of vacuum robot 15. In reticle stage 11, electrostatic chuck 63 is disposed with chuck surface 63a facing down. Then, in a state where reticle 37 is pushed to chuck surface 63a of electrostatic chuck 63 by conveyor arm 61 via lower cover member 53, the upper surface of reticle 37 is chucked to chuck surface 63a by turning on electrostatic chuck 63.

After chucking reticle 37, conveyor arm 61 carries lower cover member 53 to CFP opener 21, and lower cover member 53 is set on CFP stage 49, which is in the descended position shown in FIG. 4. Then, the upper cover member 51 and lower cover member 53 of CFP 41 are attached by raising CFP stage 49, and the inside of upper cover member 51 and lower cover member 53 is sealed airtight. In this embodiment, the closed CFP 41 is held during exposure inside CFP opener 21 in that state. Note that if the CFP opener 21 and prealignment part is separately located, it is acceptable to hold closed CFP 41 at the prealignment part. Also, it is acceptable to convey closed CFP 41 to vacuum reticle library 19 and hold the closed CFP 41 at the vacuum reticle library 19.

When exposure is completed and the exchange of reticle 37 of reticle stage 11 occurs, the upper cover member 51 and lower cover member 53 of the CFP 41 held in the state shown in FIG. 6 are separated by lowering CFP stage 49 and lowering the lower cover member 53 (corresponding to the state in FIG. 4 without reticle 37), and lower cover member 53 is conveyed to the exchange position of the reticle 37 by conveyor arm 61.

Then, with the lower cover member 53 in contact with reticle 37, which is attached to electrostatic chuck 63 (refer to FIG. 5), reticle 37 is set on lower cover member 53 by turning off electrostatic chuck 63. In this state, reticle 37 is conveyed to CFP opener 21 by conveyor arm 61 and lower cover member 53, on which is set reticle 37, is set on CFP stage 49, which is in the descended position as shown in FIG. 4. Then, by raising CFP stage 49, the upper cover member 51 of CFP 41 and lower cover member 53 are sealed (refer to FIG. 3) and CFP 41 is sealed airtight while reticle 37 is contained inside CFP 41.

In the above substrate conveyor apparatus and method, when reticle 37 is used in exposure, the upper cover member 51 and lower cover member 53 of CFP 41 are closed and the inner surfaces of upper cover member 51 and lower cover member 53 are covered; therefore, when reticle 37 is used in exposure, contamination of the inner surface of CFP 41 can be easily and reliably prevented. Then, because the inner surface of CFP 41 is not contaminated, there is very little contamination of reticle 37.

Embodiment 2

FIG. 7 shows a second embodiment of the substrate conveyor apparatus of the present invention.

Note that in this embodiment, the same members as in the first embodiment are assigned the same symbols, so detailed explanation has been omitted.

In this embodiment, as shown in FIG. 7(a), the cover member 65 that is a protective cover is mounted so that it can be attached and removed and so that it covers only pattern 37b on reticle 37.

Then, as shown in FIG. 7 (b), cover member 65 is conveyed as mounted to cover member 65 by conveyor arm 61 to electrostatic chuck 63 of reticle stage 11, then only reticle 37 is chucked to electrostatic chuck 63.

On the other hand, as shown in FIG. 7(c) cover member 65, which remains on conveyor arm 61, is conveyed to a standby part by conveyor arm 61. In the standby part, as shown in FIG. 7(d), a dummy part 67 that is similar to the shape of reticle 37 is disposed, and by mounting cover member 65 to this dummy member 67, the inner surface of cover member 65 is covered and protected by dummy member 67.

Then, when exposure is completed and the exchange of reticle 37 of reticle stage 11 occurs, cover member 65 is released from dummy member 67 and conveyed to the exchange position of the reticle 37 by conveyor arm 61. Then, after mounting cover 65 to the reticle 37 chucked to electrostatic chuck 63, reticle 37 is removed by turning electrostatic chuck 63 off. The removed reticle 37 is conveyed along with cover member 65 by conveyor arm 61 to vacuum reticle library 19, for example.

In this embodiment the similar result as in the first embodiment can be obtained.

Embodiment 3

Figure 8:
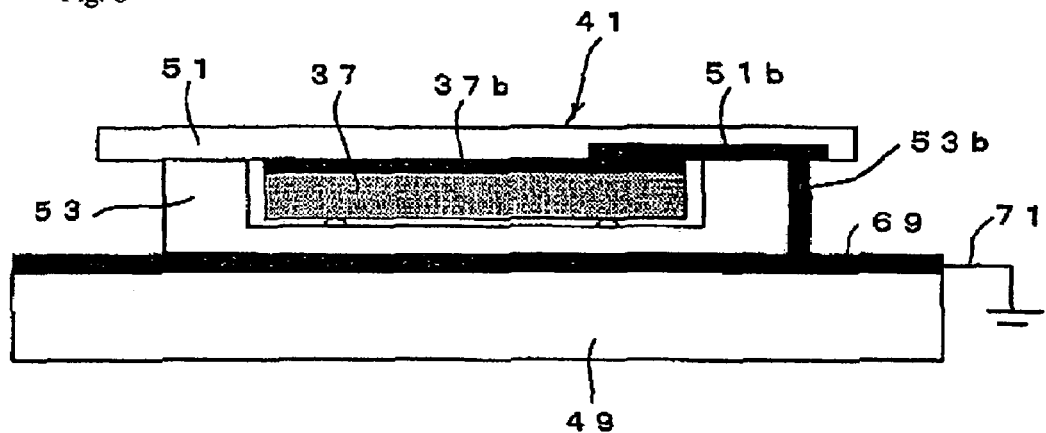
FIG. 8 is an illustration showing a third embodiment of the substrate conveyor apparatus of the present invention.

FIG. 8 shows a third embodiment of the substrate conveyor apparatus of the present invention.

Note that in this embodiment, the same members as in the first embodiment are assigned the same symbols, so detailed explanation has been omitted.

In this embodiment, a stage-side conductive layer 69 made of aluminum is formed on the upper surface of CFP stage 49 (setting machine) of CFP opener 21, for example. This stage-side conductive layer 69 is grounded via ground wire 71.

On the other hand, on the side surface of lower cover member 53 of CFP 41, when lower cover member 53 is set on stage-side conductive layer 69, a lower cover conductive layer 53b that contacts stage-side conductive layer 69 is formed. This lower cover conductive layer 53b contacts an upper cover conductive layer 51b formed on upper cover member 51 when upper cover member 51 is set on lower cover member 53. Also, on the upper surface of reticle 37, when upper cover member 51 is set, a reticle conductive layer 37b is formed that contacts upper cover conductive layer 51b.

With this embodiment, the similar result as in the first embodiment can be obtained, but in this embodiment, at CFP stage 49, lower cover member 53 of CFP 41, upper cover member 51, or reticle 37 are grounded, therefore electrostatic charging of lower cover member 53, upper cover member 51, or reticle 37 can be easily, reliably prevented. Accordingly, adhesion of particles to these members and the like can be reduced.

Note that in this embodiment, we explained an example where lower cover member 53, upper cover member 51, or reticle 37 are grounded at CFP stage 49; however, it is acceptable for example to ground the plate of vacuum reticle library 19 on which CFP 41 is set, the setting machine of load-lock chamber 23, or the parts (end effectors) of vacuum robot 15 or atmospheric robot 29 that contact CFP 41. In these cases, there are no need to ground at every location; it is acceptable to ground just those locations where one wants to prevent charging of CFP 41 and reticle 37.

Also, in the above embodiment, conductive layers 51b and 53b are formed on upper cover member 51 and lower cover member 53 of CFP 41 and when upper cover member 51 and lower cover member 53 are closed, they create a configuration where both are electrically connected. However, if upper cover member 51 and lower cover member 53 are made of conductive material (for example, aluminum), there is no special need to form a conductive layer. Then, just by placing CFP 41 on CFP stage 49 it becomes grounded. However, in case there is an insufficient electrical contact, it is acceptable to dispose a mechanical means of making a reliable electrical contact (for example a conductive needle).

The same applies to conductive layer 51b of CFP 41 upper cover member 51 and conductive layer 37b of reticle 37.

Also, in the above embodiment, a reticle-side conductive layer 37b is formed only on the upper surface of reticle 37, but it is also acceptable to form a conductive layer on a side surface or lower surface (surface where circuit pattern is formed) of the reticle. In this case, it is necessary to form the conductive layer so that it does not harm exposure, inspection, or various alignments. Also, stage-side conductive layer 69 was formed on the entire upper surface of CFP stage 49, but it is also acceptable to form only a portion of stage-side conductive layer 69, such that at least reticle 37 or CFP 41 can be grounded.

Also, as shown in FIG. 7, in the case that cover member 65 is established only on the pattern surface 37b of reticle 37, because the upper surface of reticle 37 is exposed, grounding of reticle 37 can be made directly from its upper surface, and it is also possible to ground in the same manner as the above example via cover member 65.

(Embodiment of Exposure Apparatus)

Figure 9:
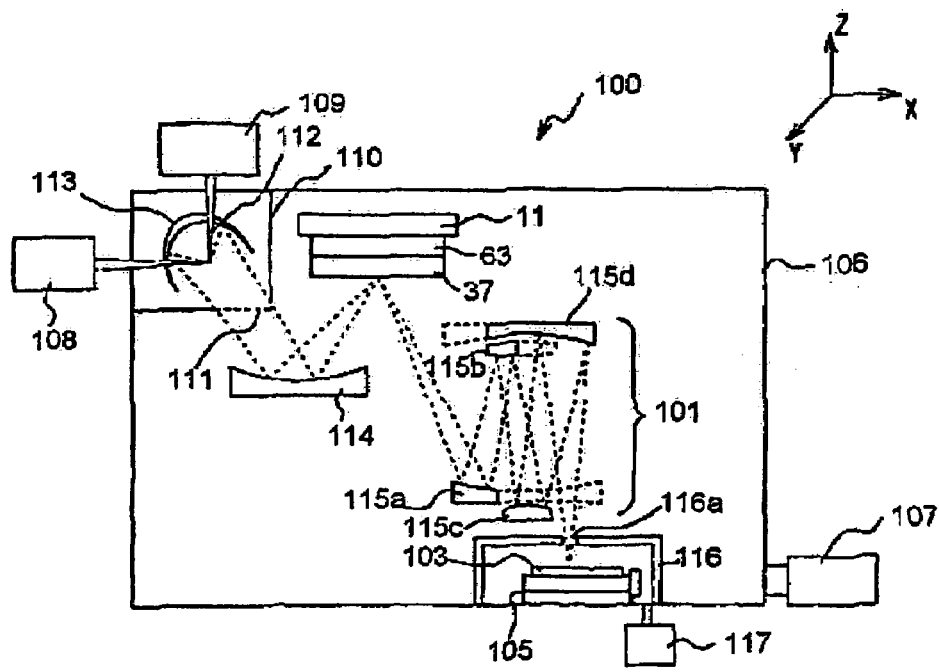
FIG. 9 is an illustration showing an embodiment of the exposure apparatus of the present invention.

FIG. 9 shows the patterning of the EUV light lithography system inside the exposure chamber 13 of FIG. 1. Note that in this embodiment, the same members as in the first embodiment are assigned the same symbols. In this embodiment, EUV light is used as the exposure light. EUV light has a wavelength of 0.1~400 nm, and for this embodiment a wavelength of 1~50 nm is preferable. The projection image is formed by using an image optics system 101, and a reduction image of the pattern on the reticle 37 is formed on wafer 103.

The pattern exposed onto wafer 103 is determined by the reflective type reticle 37 disposed on the lower side of reticle stage 11 via electrostatic chuck 63. This reflective type reticle 37 is loaded in and out by the vacuum robot 15 of the above embodiment (indication of vacuum robot 15 on the drawing is omitted). Also, wafer 103 is set on top of wafer stage 105. Typically, exposure is done by step and scanning exposure.

The EUV light used as the illumination light during exposure has low transparency in atmospheric air; for this reason the light path traveled by EUV light is enclosed by vacuum chamber 106, which maintains a vacuum using an appropriate vacuum pump 107. Also, EUV light is generated by a laser plasma X-ray source. The laser plasma X-ray source comprises laser source 108 (operated as an excitation light source) and xenon gas supply apparatus 109. The laser plasma X-ray source is enclosed by vacuum chamber 110. The EUV light generated by the laser plasma X-ray source passes through window 111 of vacuum chamber 110.

Laser source 108 generates laser light having a wavelength below ultraviolet, for example using a YAG laser or excimer laser. The laser light from laser source 108 is focused and exposed in a flow of xenon gas ejected from nozzle 112 (supplied from xenon supply apparatus 109). When laser light is exposed in the xenon flow, the laser light sufficiently warms the xenon gas, generating plasma. When the xenon gas molecules excited by the laser fall into a low energy state, EUV light photons are emitted.

A parabolic mirror 113 is disposed adjacent to the xenon gas ejection part. Parabolic mirror 113 forms a condenser optics system and is disposed so that the focus point is adjacent to the position where xenon gas is emitted from nozzle 112. EUV light is reflected on the multi-layer film of parabolic mirror 113 and reaches condenser mirror 114 through window 111 of vacuum chamber 110. Condenser mirror 114 focuses EUV light on reflecting reticle 37 and reflects it. EUV light is reflected by condenser mirror 114 and illuminates a specific portion of reticle 37. That is to say, parabolic mirror 113 and condenser 114 compose the illumination system of this apparatus.

Reticle 37 has a multilayer film that reflects EUV light and an absorbent pattern layer for forming a pattern. By reflecting EUV light with reticle 37, the EUV light is "patternized." The "patternized" EUV light reaches wafer 103 through projection system 101.

The image optics system 101 of this embodiment comprises 4 reflective mirrors: concave first mirror 115a, convex second mirror 115b, convex third mirror 115c and concave fourth mirror 115d. A multilayer film that reflects EUV light is provided on each mirror 115a~d.

The EUV light reflected from reticle 37 is reflected sequentially from first mirror 115a through to fourth mirror 115d, forming a reduced (for example, ¼, ⅕, ⅙) image of the reticle pattern. Image optics system 101 is made to be telecentric on the image side (wafer 103 side).

Reticle 37 is supported on at least the X and Y planes by movable reticle stage 11. Wafer 103 is supported by wafer stage 105, which is preferably movable in the X, Y, and Z directions. When the die on wafer 103 is exposed, EUV light is exposed to a specific region on reticle 37 by illumination system 101, and reticle 37 and wafer 103 are moved relative to image optics system 101 at a specified speed according to the reduction rate of image optics system 101. In this manner, the reticle pattern is exposed in the specified exposure area (toward the die) on wafer 103.

At time of exposure, it is desirable that wafer 103 be disposed behind a partition 116 so that the gas that is generated from the resist on wafer 103 not influence mirrors 115a~d of image optics system 101. Partition 116 has an opening 116a, and EUV light is exposed through it from mirror 115d to wafer 103. The space inside partition 116 is evacuated by vacuum pump 117. In this manner, refuse in the form of gas generated by illuminating the resist is prevented from adhering to mirrors 115a~d or to reticle 37. For that reason, deterioration of the optical properties thereof is prevented.

With the exposure apparatus of this embodiment, conveyance of reticle 37 is performed by the above substrate conveyor apparatus; therefore a high yield product can be obtained using a reticle 37 with little contamination.

(Supplemental Items for the Embodiments)

In the above we explained the present invention by means of the above embodiments, but the technical scope of the present invention is not limited to the above embodiments. For example, the following forms are acceptable.

(1) For the above embodiment, we explained an example where the inner surface of CFP 41 is covered when reticle 37 is used in exposure, but it is also acceptable for example to cover the inner surface of CFP 41 when reticle 37 is used in inspection, cleaning, etc.

(2) For the above first embodiment, we explained an example where the protective cover for reticle 37 is composed of two members which are an upper cover member 51 and a lower cover member 53, but it is also acceptable for example to be composed of 3 or more members.

For the above embodiment, we explained an example of an exposure apparatus that uses EUV light, but other than this it is also acceptable to broadly apply an exposure apparatus using charged particle beams, i-line, g-line, KrF, ArF, F2 and the like.

What is claimed is:

1. A substrate conveyor apparatus for carrying a substrate on which patterns are formed, the substrate conveyor apparatus comprising:
   a substrate removing position;
   a standby position; and
   a protective cover comprising a first cover member and a second cover member disposed so as to cover the substrate,
   wherein the protective cover protects the substrate when the substrate is covered by the protective cover, and the first cover member and the second cover member close to cover an inner surface of the protective cover when the substrate is removed from the protective cover, and
   wherein the substrate conveyor apparatus is configured to, after removing the second cover member from the first cover member and after carrying the substrate with the first cover member to the substrate removing position, return the first cover member to the standby position and, together with the second cover member, hold the protective cover in a closed state.

2. The substrate conveyor apparatus described in claim 1, wherein the first cover member and the second cover member cover the inner surface of the protective cover while the substrate is used in exposure.

3. The substrate conveyor apparatus described in claim 1, wherein the closed state of the protective cover is a state in which the first cover member and the second cover member are sealed.

4. The substrate conveyor apparatus described in claim 1, wherein the standby position is in a library part that stores the substrate in an exposure environment.

5. The substrate conveyor apparatus described in claim 1, wherein the protective cover is grounded at the standby position.

6. An exposure apparatus having a substrate conveyor apparatus described in claim 1.

7. A substrate conveyor apparatus for carrying a substrate on which patterns are formed, the substrate conveyor apparatus comprising:
   a standby position;
   a cover member; and
   a dummy member that is similar to the shape of the substrate, wherein the substrate conveyor apparatus is configured to hold the cover member in the standby position and mount the dummy member to the cover member when the substrate is removed from the cover member.

8. The substrate conveyor apparatus described in claim 7, wherein the standby position is a position of the substrate conveyor apparatus that performs alignment of the substrate.

9. The substrate conveyor apparatus described in claim 7, wherein the standby position is in a library part that stores the substrate in an exposure environment.

10. The substrate conveyor apparatus described in claim 7, wherein the cover member is grounded at the standby position.

11. An exposure apparatus, comprising the apparatus recited in claim 7.

12. A substrate conveyor apparatus for carrying a substrate on which patterns are formed, the substrate conveyor apparatus comprising:
 a standby position; and
 a protective cover comprising a first cover member and a second cover member disposed so as to cover the substrate,
 wherein the protective cover protects the substrate when the substrate is covered by the protective cover, and the first cover member and the second cover member close to cover an inner surface of the protective cover when the substrate is removed from the protective cover,
 wherein the substrate conveyor apparatus is configured to hold the first cover member and the second cover member in the standby position when the first cover member and the second cover member are closed, and
 wherein the standby position is a position of the substrate conveyor apparatus that is configured to perform alignment of the substrate.

13. An exposure apparatus, comprising the apparatus recited in claim 12.

14. A substrate conveyance method for carrying a substrate on which patterns are formed, the method comprising the steps of:
 carrying a substrate in a state protected by a protective cover, the protective cover comprising a first cover member and a second cover member;
 removing the second cover member from the first cover member;
 carrying the substrate along with the first cover member to a substrate removal position;
 removing the substrate from the first cover member; and
 covering the first cover member with the second cover member after removing the substrate, thereby covering an inner surface of the protective.

15. An exposure apparatus for performing a substrate conveyance method described in claim 14.

16. The substrate conveyance method of claim 14, further comprising the steps of:
 returning the substrate to the first cover member after using the substrate in an exposure position by:
  removing the second cover member from the first cover member; and
  mounting the substrate in the first cover member; and
 re-covering the first cover member with the second cover member after returning the substrate to the first cover member, thereby returning the substrate to the state protected by the protective cover.

17. An apparatus for conveying a reticle, the apparatus comprising:
 a reticle exposure position;
 a standby position; and
 a reticle protector comprising a first cover member and a second cover member disposed so as to cover the reticle,
 wherein the reticle protector protects the reticle when the reticle is covered by the reticle protector, and the first cover member and the second cover member close to cover an inner surface of the reticle protector when the reticle is removed from the protective cover,
 wherein the apparatus is configured to, after removing the second cover member from the first cover member and after carrying the reticle along with the first cover member to a reticle exposure position, return the first cover member to a standby position and, together with the second cover member, hold the protective cover in a closed state.

18. The apparatus of claim 17, wherein the first cover member and the second cover member enclose the reticle when the reticle is not in use.

19. The apparatus of claim 17, wherein the first cover member and the second cover member are sealed airtightly when the reticle is removed from the reticle protector, so as to protect the inner surface of the reticle protector.

20. The apparatus of claim 17, further comprising a dummy member having a shape similar to that of the reticle, wherein the apparatus is configured to introduce a dummy member into the reticle protector when the reticle is removed from the reticle protector, so as to protect the inner surface of the reticle protector.

21. The apparatus of claim 17, wherein the reticle protector comprises a conductive layer.

22. The apparatus of claim 21, wherein the conductive layer is grounded when the reticle is removed from the reticle protector.

23. The apparatus of claim 21, wherein the conductive layer couples to a reticle conductive layer of the reticle when the reticle is held in one of the first cover member or the second cover member, and the conductive layer is grounded.

24. An exposure apparatus, comprising the apparatus recited in claim 17.

25. A cover member protection method, the method comprising:
 carrying a substrate on a cover member;
 removing the substrate from the cover member;
 holding the cover member in a standby position; and
 mounting a dummy member that is similar to the shape of the substrate to the cover member to protect a surface of the cover member.

26. An exposure apparatus for performing a cover member protection method of claim 25.

* * * * *

UNITED STATES PATENT AND TRADEMARK OFFICE
CERTIFICATE OF CORRECTION

| | |
|---|---|
| PATENT NO. | : 7,483,123 B2 |
| APPLICATION NO. | : 11/235130 |
| DATED | : January 27, 2009 |
| INVENTOR(S) | : Noriyuki Hirayanagi |

It is certified that error appears in the above-identified patent and that said Letters Patent is hereby corrected as shown below:

Claim 14, col. 9, line 50, "an inner surface of the protective." should read --an inner surface of the protective cover--.

Signed and Sealed this

Twelfth Day of May, 2009

JOHN DOLL
*Acting Director of the United States Patent and Trademark Office*